(12) United States Patent
Wilner et al.

(10) Patent No.: US 8,191,420 B2
(45) Date of Patent: Jun. 5, 2012

(54) PROOF MASS FOR MAXIMIZED, BI-DIRECTIONAL AND SYMMETRIC DAMPING IN HIGH G-RANGE ACCELERATION SENSORS

(75) Inventors: Leslie Bruce Wilner, Palo Alto, CA (US); Tom Kwa, San Jose, CA (US)

(73) Assignee: Meggitt (San Juan Capistrano), Inc., San Juan Capistrano, CA (US)

( * ) Notice: Subject to any disclaimer, the term of this patent is extended or adjusted under 35 U.S.C. 154(b) by 27 days.

(21) Appl. No.: 12/806,415

(22) Filed: Aug. 12, 2010

(65) Prior Publication Data

US 2011/0041608 A1 Feb. 24, 2011

Related U.S. Application Data

(60) Provisional application No. 61/233,522, filed on Aug. 13, 2009.

(51) Int. Cl.
*G01P 15/08* (2006.01)
*G01P 15/10* (2006.01)
*G01P 15/12* (2006.01)

(52) U.S. Cl. ............... 73/514.16; 73/514.29; 73/514.33

(58) Field of Classification Search ............... 73/514.14, 73/514.33, 514.34, 514.05, 514.06, 514.07, 73/514.12, 514.16, 514.36, 514.38, 514.29
See application file for complete search history.

(56) References Cited

U.S. PATENT DOCUMENTS

| | | | |
|---|---|---|---|
| 3,709,042 A | 1/1973 | Lee et al. | 73/514.13 |
| 4,430,895 A * | 2/1984 | Colton | 73/497 |
| 4,498,229 A | 2/1985 | Wilner | 438/52 |
| 4,825,335 A * | 4/1989 | Wilner | 361/283.3 |
| 5,121,180 A | 6/1992 | Beringhause et al. | 257/417 |
| 5,165,279 A | 11/1992 | Norling et al. | 73/514.14 |
| 5,461,918 A | 10/1995 | Mozurkewich | 73/514.26 |
| 5,507,182 A * | 4/1996 | Yamada et al. | 73/514.33 |
| 5,656,846 A * | 8/1997 | Yamada | 257/420 |
| 5,760,290 A * | 6/1998 | Ueyanagi | 73/1.39 |
| 6,151,967 A | 11/2000 | McIntosh et al. | 73/514.32 |
| 7,022,543 B2 | 4/2006 | Eskridge et al. | 438/52 |
| 7,650,787 B2 * | 1/2010 | Ino | 73/514.33 |
| 2006/0195305 A1 | 8/2006 | LaFond | 703/2 |
| 2007/0163346 A1 | 7/2007 | Platt et al. | 73/504.16 |

* cited by examiner

*Primary Examiner* — Helen C. Kwok
(74) *Attorney, Agent, or Firm* — Paul Davis; Goodwin Procter LLP

(57) ABSTRACT

A new high G-range damped acceleration sensor is proposed with a proof mass optimized for maximized, bi-directional and symmetrical damping to accommodate acceleration ranges above and beyond several thousand G's. In order to achieve the maximum, bi-directional and symmetrical damping, the high G-range acceleration sensor is designed to have minimum amount of mass in the proof mass while maximizing its surface areas. Such high G-range damped acceleration sensor can be applied to any application in which damping (or suppression of ringing) is desired at quite high frequencies.

14 Claims, 6 Drawing Sheets

_US 8,191,420 B2_

PROOF MASS FOR MAXIMIZED, BI-DIRECTIONAL AND SYMMETRIC DAMPING IN HIGH G-RANGE ACCELERATION SENSORS

RELATED APPLICATIONS

This application claims priority to U.S. Provisional Patent Application No. 61/233,522, filed Aug. 13, 2009, and entitled "Proofmass for maximized, bi-directional and symmetric damping in high G-range acceleration sensors," by Leslie Bruce Wilner and Tom Kwa, and is hereby incorporated herein by reference.

BACKGROUND

An accelerometer (acceleration sensor) includes a seismic or proof mass on a spring. When the accelerometer experiences an external force such as gravity, the proof mass is displaced until the external force is balanced by the spring force. The displacement is translated into an electrical signal proportional to acceleration.

Modern accelerometers are often small micro electro-mechanical systems (MEMS), with certain designs based on a proof mass suspended by one or more cantilever beams. Under the influence of external accelerations the proof mass deflects from its neutral position. This deflection is measured using some transduction method. Most commonly, the capacitance between a set of fixed beams and a set of beams attached to the proof mass is measured. This method is simple, reliable, and inexpensive, but requires signal conditioning close to the sensing parts. Integrating piezoresistors in the springs to detect spring deformation, and thus deflection, is a good alternative, although a few more process steps are needed during the fabrication sequence. For very high sensitivities quantum tunneling is also used; this requires a dedicated process making it very expensive. Optical measurement has been demonstrated on laboratory scale.

Another, far less common, type of MEMS-based accelerometer contains a small heater at the bottom of a very small dome, which heats the air inside the dome to cause it to rise. A thermocouple on the dome determines where the heated air reaches the dome and the deflection off the center is a measure of the acceleration applied to the sensor.

Most micro electro-mechanical accelerometers operate in-plane, that is, they are designed to be sensitive only to a direction in the plane of the die. By integrating two devices perpendicularly on a single die a two-axis accelerometer can be made. By adding an additional out-of-plane device three axes can be measured. Such a combination always has a much lower misalignment error than three discrete models combined after packaging.

Micromechanical accelerometers are available in a wide variety of measurement ranges, reaching up to thousands of G's and beyond. By way of illustration, and without limitation, high G sensors can achieve a measurement range of at least 10,000G. For high G sensors, the design should include a damping mechanism (damper) to properly damp or suppress the motion or ringing of the proof mass and its supporting frame, which, for a non-limiting example, can be achieved with squeeze-film damping. The designer must make a compromise between sensitivity and the maximum acceleration that can be measured. There are other, basic, economic restraints on acceleration sensor design. For non-limiting examples, small sensor size is important both for cost and for application of the sensor and the means of fabrication of the sensor must be established.

There exist ways to adapt an existing low-range acceleration sensor to a higher range one. One approach is to stiffen the measuring structure (e.g., the frame to support the proof mass) of the sensor, but such stiffening would quickly outrun both the available damping of the proof mass and its coupling to the damper of the sensor. Another approach is to diminish the area of the proof mass. However, reducing the area of the proof mass also diminishes the coupling to the damper linearly, and the damping coefficient and effectiveness of the damper more strongly than linearly.

The foregoing examples of the related art and limitations related therewith are intended to be illustrative and not exclusive. Other limitations of the related art will become apparent upon a reading of the specification and a study of the drawings.

DETAILED DESCRIPTION OF EMBODIMENTS

The device is illustrated by way of example and not by way of limitation in the figures of the accompanying drawings in which like references indicate similar elements. It should be noted that references to "an" or "one" or "some" embodiment(s) in this disclosure are not necessarily to the same embodiment, and such references mean at least one.

A high G-range damped acceleration sensor is proposed with a proof mass optimized for maximized, bi-directional and symmetrical damping to accommodate acceleration ranges above and beyond several thousand G's. In order to achieve the maximum, bi-directional and symmetrical damping, the high G-range acceleration sensor is designed to have minimum amount of mass in the proof mass with maximum surface areas. Such high G-range damped acceleration sensor can be applied to any application in which damping (or suppression of ringing) is desired at quite high frequencies.

Figure 1A:
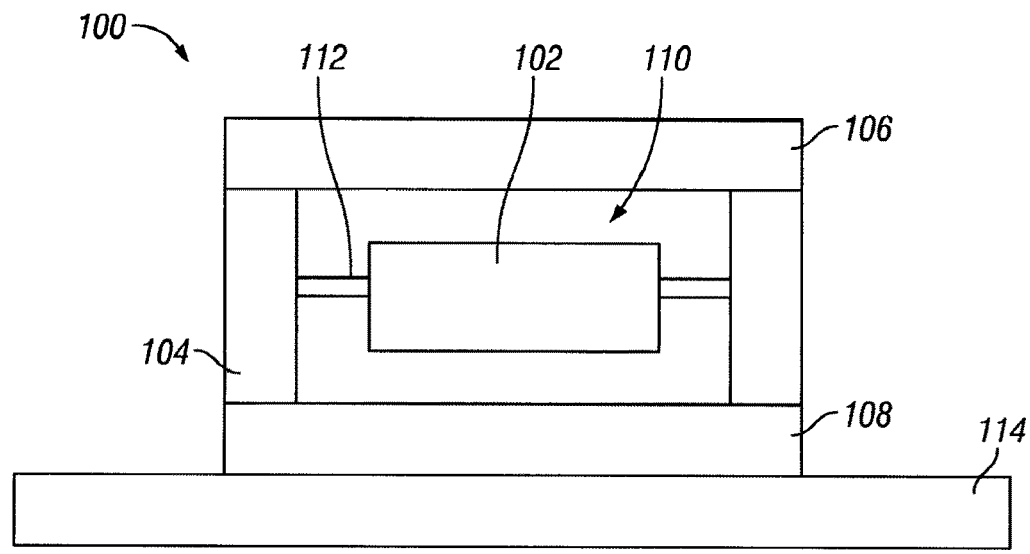
FIG. 1($a$) depicts an example of a complete high G-range acceleration sensor and FIG. 1($b$) depicts a detailed view of an example of a measuring support.

FIG. 1($a$) depicts an example of a complete high G-range acceleration sensor 100 with an active part proof mass 102 and two passive parts a "lid" 106 and a "base" 108 forming the top and the bottom portion of the supporting frame 104 of the acceleration sensor 100. Here, frame 104 is a physical structure connecting the measuring system (e.g., proof mass 102 and measuring support 112) to the subject 114 being measured. Damper 110 is positioned on both surfaces of proof mass 102 between proof mass 102 and lid 106 and base 108, respectively, to suppress the ringing of the proof mass 102 when measuring the acceleration motion of the subject to be measured (not shown). Measuring support 112 is a physical structure that connects proof mass 102 to frame 104. FIG. 1($b$) depicts a detailed view of an example of measuring support 112. Here, 102 represents the entire proof mass and 104 represents the entire supporting frame as shown in FIG.

Figure 1B:
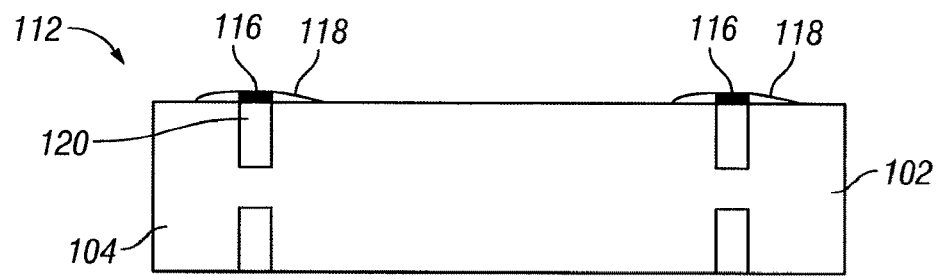

1(a). As shown in FIG. 1(b), measuring support 112 further comprises piezoresistive gage 116 over groove 120 etched on the measuring support 112, wherein piezoresistive gage 116 converts measured acceleration into electronic signals. Electrical contact 118 connected to piezoresistive gage 116 provides the measured electronic signals to outside circuits. More detailed descriptions of piezoresistive gages and other components suitable in whole or in part to be utilized in the present application are disclosed in U.S. Pat. Nos. 6,988,412 and 7,392,716.

In one embodiment, damper 110 comprises of gas and space around it. In one embodiment, squeezed films of gas can be utilized as dampers 110 on either side of the proof mass 102 to damp the motion of the proof mass during acceleration. Here, the squeezed gas films must be applied approximately equally on both sides of the proof mass 102 in order to avoid false signals from rectification of vibration. In order for damper 110 to perform properly, its damping coefficient, force/velocity, must be comparable to the critical damping of the proof mass 102 and its measuring support 112, where the critical damping is twice the square root of the product of the proof mass and the stiffness of the measuring support. In addition, the stiffness of the damper 110 must be comparable to (or greater than) the stiffness of support 112 of the proof mass 102.

In one embodiment, the high G-range acceleration sensor 100 can be created from a low G-range acceleration sensor with acceleration ranges of 500 Gs and 2,000 Gs by removing portion of the proof mass 102 from the low G-range acceleration sensor without greatly diminishing its size. The mass removal leaves surface(s) of the proof mass that continue the damping function and effectiveness of the lower G-range version acceleration sensor.

In one embodiment, the maximum surface area and minimum proof mass design of the high G-range acceleration sensor can be achieved via a light-weight structure of the proof mass in the form of skins (surfaces) held together by a sufficiently rigid frame, consisting of a web of vertical walls, to maximize the capture of air movement caused by motion of the proof mass, analogous to a kite with a light frame and a large surface area to catch the wind. Unlike the kite, however, the proof mass of the sensor needs to be able to capture air movement coming from both sides depending on the direction of acceleration applied to the sensor. The sensor achieves such bi-directionality by providing two opposite surfaces of the proof mass with the frame in the middle of the structure. Finally, symmetrical damping can be achieved by making the surface areas on both sides of the proof mass of equal size.

In one embodiment, mass material can be removed from the center of the proof mass, leaving opposing skins/surfaces and interior hollow spaces to form open cells. In one embodiment, the amount of mass material removed from the proof mass can be in an amount of about 50-90%. The removal of half or more of the proof mass still provides fair coupling from damper to proof mass and enough damping coefficient to suppress the ringing of the proof mass which is usually associated with very high range acceleration sensors.

Figure 2A:
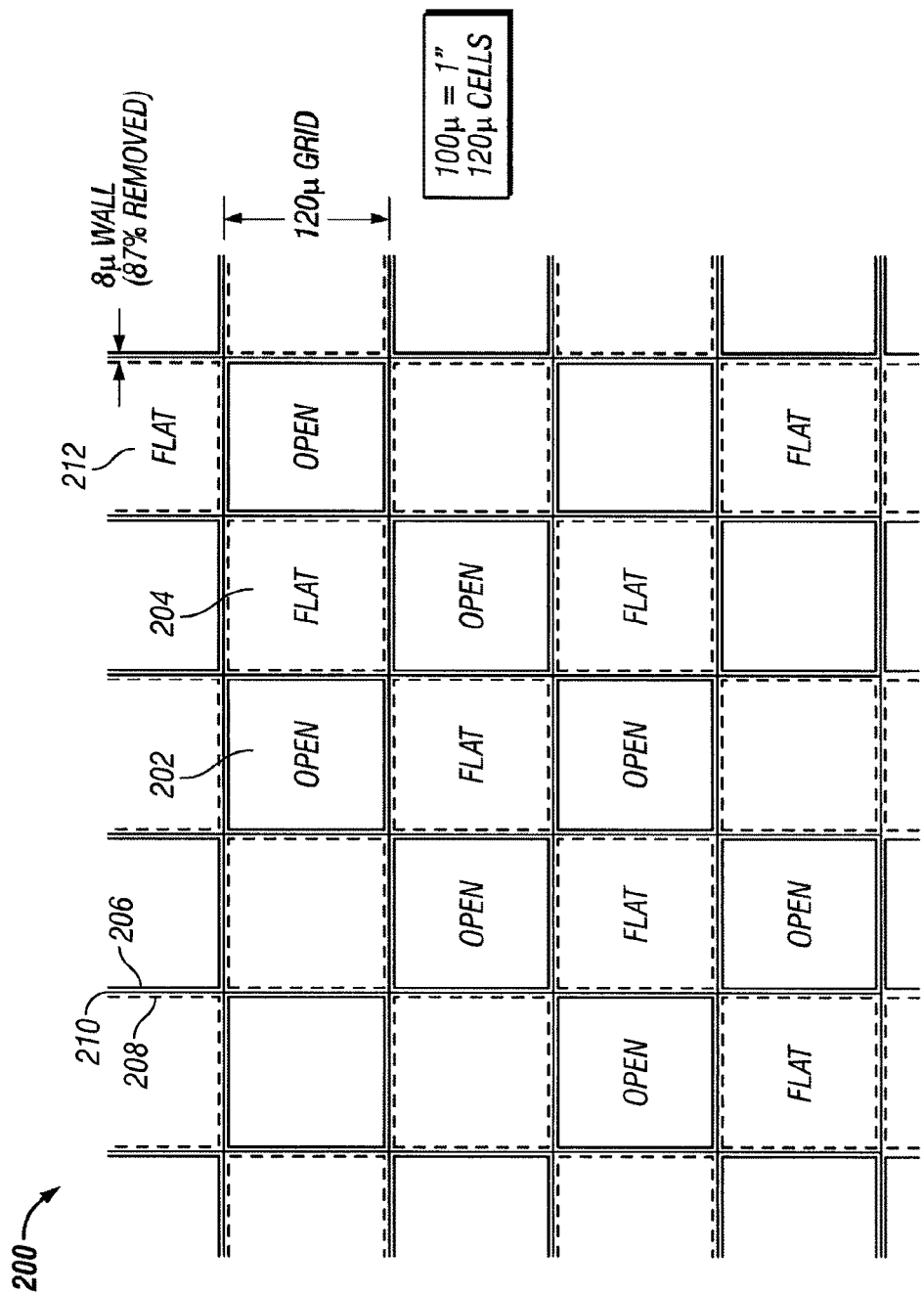
FIGS. 2($a$)-($b$) illustrate examples of proof mass of a high G-range acceleration sensor with the proof mass having opposing open and closed/flat skins and cells arranged in a checkerboard manner.

FIG. 2(a) illustrates an example of proof mass 200 (102 in FIG. 1) of the high G-range acceleration sensor having opposing open and closed/flat skins and cells arranged in a checkerboard manner where 87% of mass materials removed. Alternatively, the cells can also be arranged in row patterns instead of the checker board pattern. FIG. 2(a) is a top view of a portion of the proof mass 200, also referred to as the "core" of the sensor, comprised of open cells 202 and flat or closed cells 204 arranged in a checkerboard manner with visible 206 and hidden 208 narrow walls at cell boundaries 210. As shown in FIG. 2(a), the proof mass can be etched to be full of voids—open cells 202, while retaining enough of its flat skin/surface area 212 for damping and coupling.

Figure 2B:
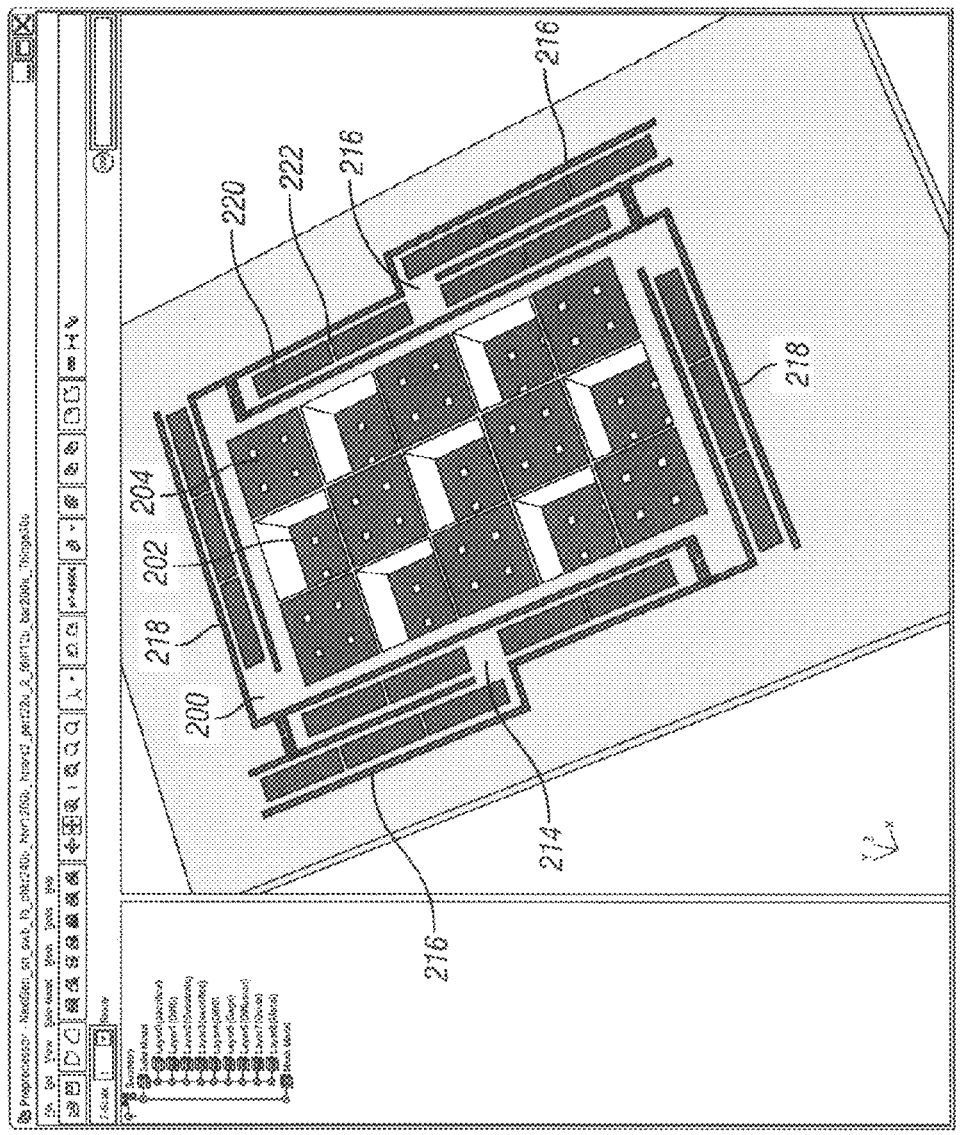

FIG. 2(b) depicts a high G-range acceleration sensor with the proof mass as its core. The central area of FIG. 2(b) is the proof mass 202 having open 202 and closed cells 204. The proof mass 200 is supported against motion through the plane by two cantilever beams 214, one along either long side of the proof mass 200. Measurement of acceleration through the plane is accomplished by piezoresistive structures at the mass-ends and at the frame-ends of these cantilever beams 214. Another pair of cantilever beams 216 outside the measuring cantilever beams 214 provides electrical pathways from the measuring beams 214 to frame 104 shown in FIG. 1. Yet another pair of cantilevers 218, along the short ends of the proof mass 200 provides electrical pathways from the proof mass 200 to the frame 104, and also gives mechanical support against accelerations transverse to the measuring beams 214. Slots 220 used to etch grooves in the proof mass 200 are interrupted by continuous lines or ribs 222 across the surface 212 for enhanced rigidity. Interruptions to the slots are narrow and can be achieved with Deep Reactive-Ion Etch (DRIE) technology as discussed in details below.

Figure 3:
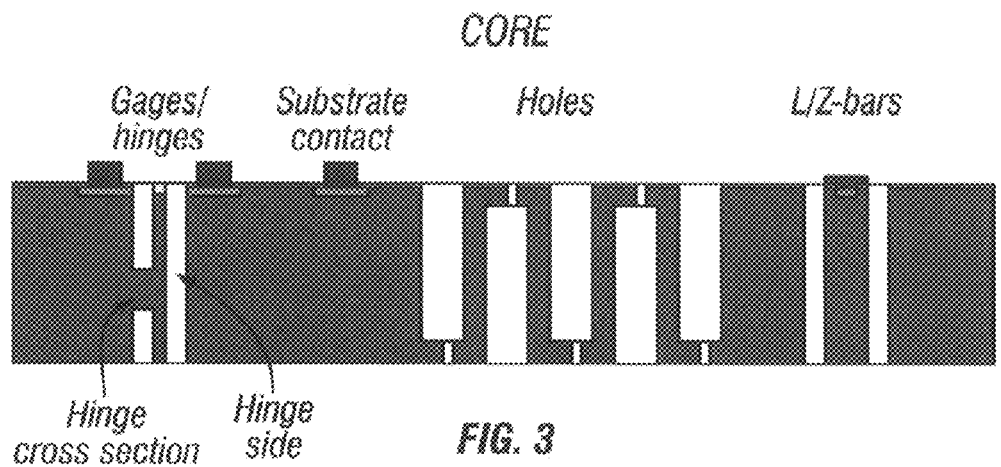
FIG. 3 illustrates an example of a simplified and compressed cross-sectional view of various parts of the high G-range acceleration sensor as shown in FIG. 2($b$).

FIG. 3 illustrates an example of a simplified and compressed cross-sectional view of the various parts of the high G-range acceleration sensor as shown in FIG. 2(b). These parts include but are not limited to at least the components of, gages and hinges 310 (with both side and cross section shown), substrate contacts 320, holes 330, cantilever 340, and bending bars 350.

In one embodiment, minimum proof mass and maximum surface area of the high G-range acceleration sensor can be achieved by removing mass material from the proof mass via a variety of ways of etching including but not limited to, silicon etch, dry silicon etch, sacrificial etch and the like.

In one embodiment, Deep Reactive Ion Etching (DRIE) techniques are adopted for the manufacturing of the high G-range acceleration sensor. More specifically, DRIE etches vertically into the wafer, consumes the surface it enters, but potentially leaves the far surface untouched. If DRIE is applied to both surfaces of the proof mass in checkerboard patterns as shown in FIGS. 2(a)-(b), about half the original surface is consumed, but the proof mass is left with an array of open cells with shared cell walls. Half of the cell-bottoms are at one surface, half at the other surface. The cells may be adjusted in size and shape to fit into larger structures in the high G-range acceleration sensor as shown in FIG. 2(b). In one embodiment, the shared cell walls may be very thin and narrow, while still providing good rigidity to the structure of the acceleration sensor. Since etching to leave uniformly thin cell-bottoms throughout a manufacturing lot can be a problem for manufacturing control, the cell bottoms tend to be thicker than the cell walls.

Figure 4A:
FIGS. 4-6 illustrate an example of a process to manufacture the high G-range acceleration sensor as shown in the compressed cross-sectional view of FIG. 3 using DRIE technology.
Figure 4B:
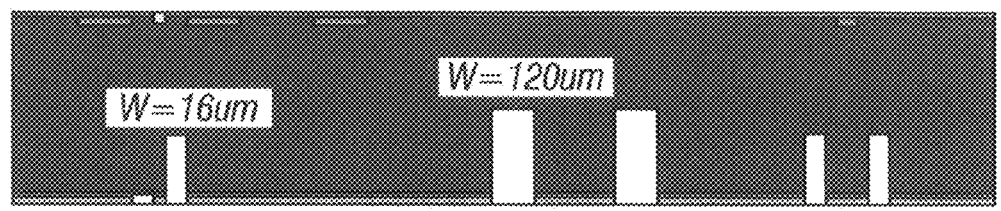
Figure 4C:
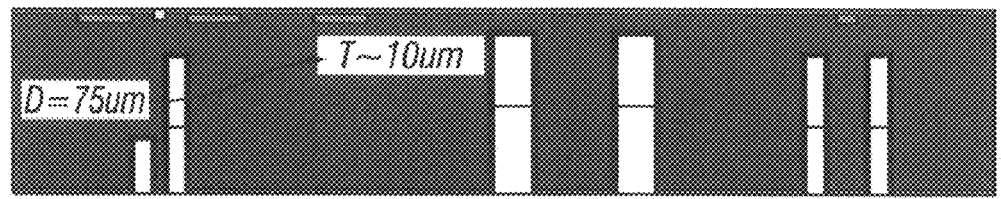
Figure 5A:
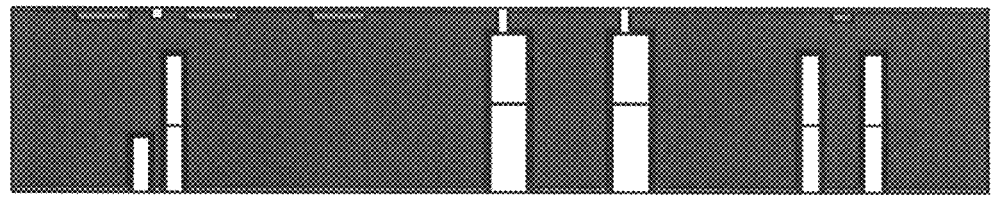
Figure 5B:
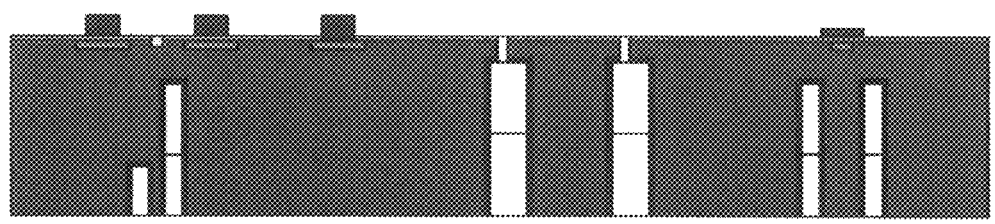

FIGS. 4-6 illustrate an example of a process to manufacture the high G-range acceleration sensor as shown in the compressed cross-sectional view of FIG. 3 using DRIE technology. The surface with the electrical features (gages, contacts, traces) is referred to hereinafter as the front surface; the surface with only slots and cavities is referred to hereinafter as the back surface.

An initial oxidation is first performed on the front surface of a wafer as shown in FIG. 4(a). One or more of: a diffusion mask, an oxide etch, resist strip, boron or other material deposition, implant mask, implant, resist strip, and anneal can then be applied to create piezoresistors as shown in FIG. 4(a). Highly doped diffused areas are created for contact and less doped areas are created for gages on the front surface.

The process to manufacture the high G-range acceleration sensor continues to the back surface to create partial completion of front surface diaphragms, hinges and bars by applying one or more of: a headstart mask at the back surface, an oxide etch, a resist strip, and a recess mask at the back surface as shown in FIGS. 4(b)-(c). As shown in FIG. 4(b), an etch is performed on the back surface for the large cavities and for slots that, later, will be cut through. Then, as shown in FIG. 4(c), additional areas, needing less etch depth, are opened through the oxide. The etching continues until the net residual at the bottom of the large cavities is 10 μm and a new oxide layer is then grown.

Returning to the front surface, front surface holes can then be created by applying one or more of: a small hole mask in the front surface, deep silicon etched through the bottoms of the cavities etched from the back surface stopping on oxide, and a resist strip as shown in FIG. 5(a).

Figure 5C:
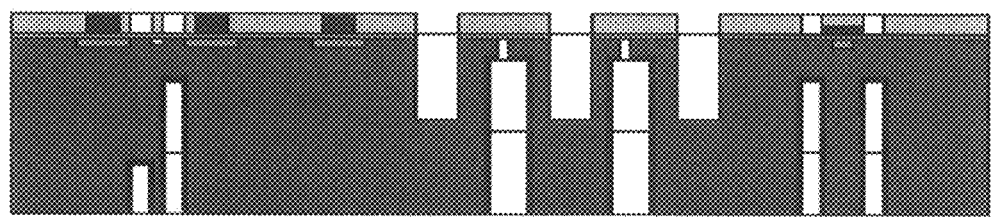

Continuing on the front surface, a contact mask can be used to open contacts through the oxide with an oxide etch, a resist strip and a deposition to create electrical contacts to the silicon and electrical leads as shown in FIG. 5 (b). As a non-limiting example, the deposition can be aluminum of about 3000 Angstroms thick, patterned to connect among these contacts. Trace masks can also be used, followed by an etch, such as an aluminum etch, a resist strip, a deposition through a shadow mask, which by way of illustration can be aluminum and a pad mask. As shown in FIG. 5(c), a thick photo-resist mask (a headstart mask) for the front surface can be used to open more areas through the front surface oxide to prepare for further etching, followed by an oxide etch (to create large cavities), a resist strip, a recess mask for the front surface and deep silicon etching to partially complete the back surface diaphragms.

Figure 6A:
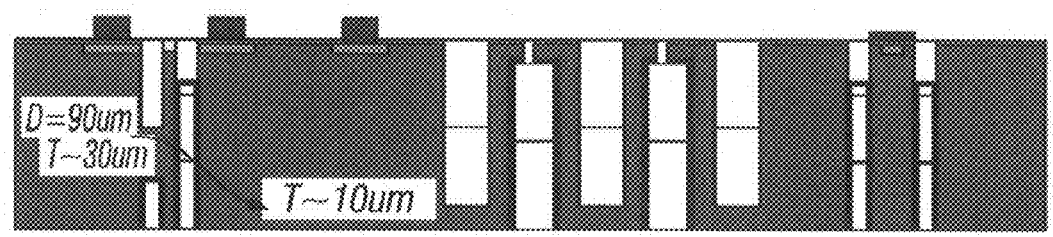
Figure 6B:
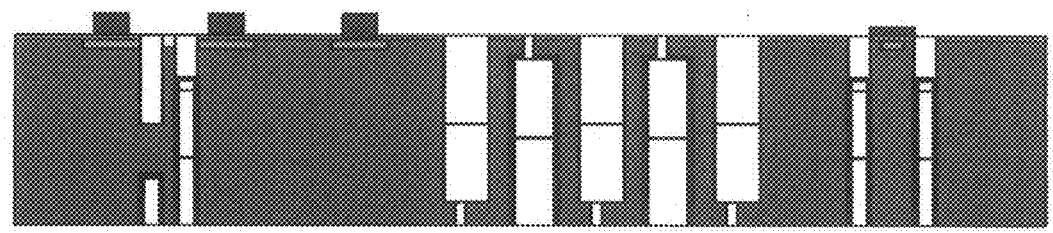
Figure 6C:
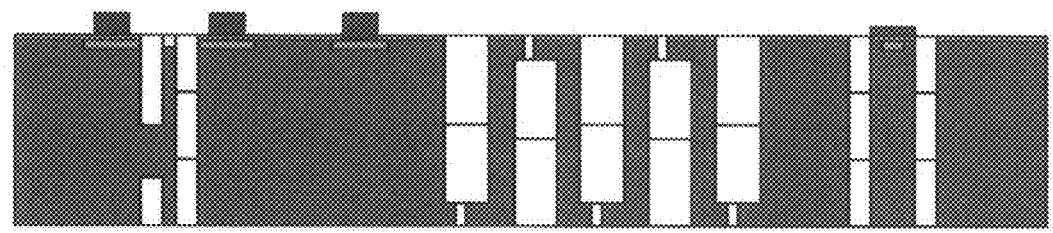

Another front surface etch as shown in FIG. 6(a) brings the residual at the bottom of the cavities to 10 μm, and brings through-slots to the oxide formed from the back surface. As shown in FIG. 6(b), another thick (transferred) resist mask (a hole mask) on the back surface is used to etch small holes from the back surface to the bottoms of the cavities etched from the front surface. As shown in FIG. 6(c), the oxide left from FIG. 4(c) is removed from the back surface cavities.

Other embodiments of the invention will be apparent to those skilled in the art from consideration of the specification and practice of the invention disclosed herein. It is intended that the specification and examples be considered as exemplary only, with a true scope and spirit of the invention being indicated by the appended claims.

What is claimed is:

1. An acceleration sensor, comprising:
a proof mass having opposing and alternating open and closed cells with flat surfaces adjacent to each other and separated by thin walls at cell boundaries in order to retain minimum amount of mass and to achieve maximum surface areas for maximized damping of the sensor;
one or more dampers on both side of the proof mass to damp motion of the proof mass;
one or more measuring supports connecting the proof mass to a frame;
said frame connecting the sensor to a subject being measured to measure the acceleration of the subject.

2. The sensor of claim 1, further comprising:
two cantilever measure beams, one along either long side of the proof mass to measure acceleration through a plane.

3. The sensor of claim 2, further comprising:
a pair of cantilever beams outside the cantilever beams, providing electrical pathways from the measure beams to the frame.

4. The sensor of claim 2, further comprising:
a pair of cantilevers along short ends of the proof mass, providing electrical pathways from the proof mass to the frame, and also gives mechanical support against accelerations transverse to the measure beams.

5. The sensor of claim 1, wherein:
each of the one or more measuring supports further comprises piezoresistive gages, grooves, and electrical contacts.

6. The sensor of claim 1, wherein:
the surface areas on two opposite sides of the proof mass are of approximately equal size in order to achieve symmetrical damping of the sensor.

7. The sensor of claim 1, wherein:
the proof mass has two opposite surfaces in order to achieve bi-directional damping of the sensor.

8. The sensor of claim 1, wherein:
each damper is a squeezed film of gas.

9. The sensor of claim 1, wherein:
the dampers act approximately equally on both sides of the proof mass in order to avoid false signals from rectification of vibration.

10. The sensor of claim 1, wherein:
the sensor has a light-weight structure in the form of surfaces held together by a sufficiently rigid frame to maximize the capture of the motion coming from both sides of the proof mass depending on the direction of acceleration applied to the sensor.

11. The sensor of claim 1, wherein:
the cells are arranged in a checkerboard manner.

12. The sensor of claim 1, wherein:
the cells are arranged in row patterns.

13. The system of claim 1, wherein:
boundaries of the cells are formed with visible and hidden narrow walls.

14. The sensor of claim 13, wherein:
The walls are very thin and narrow, while still providing good rigidity to the structure of the acceleration sensor.

* * * * *